United States Patent
Yamazawa et al.

(10) Patent No.: US 7,758,929 B2
(45) Date of Patent: Jul. 20, 2010

(54) PLASMA PROCESSING APPARATUS AND METHOD

(75) Inventors: Yohei Yamazawa, Nirasaki (JP); Noriaki Imai, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 468 days.

(21) Appl. No.: 11/691,678

(22) Filed: Mar. 27, 2007

(65) Prior Publication Data

US 2007/0228009 A1 Oct. 4, 2007

Related U.S. Application Data

(60) Provisional application No. 60/792,317, filed on Apr. 17, 2006.

(30) Foreign Application Priority Data

Mar. 31, 2006 (JP) .............................. 2006-097446

(51) Int. Cl.
*H05H 1/24* (2006.01)
(52) U.S. Cl. ........................ 427/569; 438/714; 427/457; 427/578; 427/579; 427/585; 427/58; 427/248.1; 427/255.11; 427/255.15; 427/255.18
(58) Field of Classification Search ................ 438/714, 438/719, 721, 738
See application file for complete search history.

(56) References Cited

U.S. PATENT DOCUMENTS 6,103,631 A * 8/2000 Soda et al. .................. 438/714
2004/0035365 A1 2/2004 Yamazawa et al.

FOREIGN PATENT DOCUMENTS

JP 2004-96066 3/2004

* cited by examiner

*Primary Examiner*—Michael Barr
*Assistant Examiner*—Andrew Bowman
(74) *Attorney, Agent, or Firm*—Oblon, Spivak, McClelland, Maier & Neustadt, L.L.P.

(57) ABSTRACT

In a plasma processing apparatus in which a radio-frequency power from a radio-frequency power source is supplied to at least one of an upper electrode and a lower electrode disposed to vertically face each other in a process vessel, to thereby generate, in the process vessel, plasma with which a substrate is processed, a chemical component emitting member which is caused to emit a chemical component necessary for processing the substrate into the process vessel by entrance of ions in the plasma generated in the process vessel is provided in the process vessel in an exposed state, and an impedance varying circuit varying impedance on the chemical component emitting member side of the plasma generated in the process vessel to frequency of the radio-frequency power source is connected to the chemical component emitting member.

10 Claims, 5 Drawing Sheets (a)　　　(b)

PLASMA PROCESSING APPARATUS AND METHOD

CROSS REFERENCE TO RELATED APPLICATIONS

The present invention contains subject matter related to Japanese Patent Application No. 2006-097446, filed on Mar. 31, 2006 and Provisional Application No. 60/792,317, filed on Apr. 17, 2006, the entire contents of which being incorporated herein by reference.

BACKGROUND OF THE INVENTION

1. Field of the Invention

The present invention relates to a plasma processing apparatus and a plasma processing method for processing a substrate with plasma generated in a process vessel.

2. Description of the Related Art

In manufacturing processes of, for example, a semiconductor device, a liquid crystal display device, and the like, plasma processing by a plasma processing apparatus is widely used for subjecting a semiconductor wafer to processing such as etching and film formation Such a plasma processing apparatus includes, in a process vessel, upper and lower electrodes facing each other, and a radio-frequency power is supplied to the lower electrode on which, for example, a substrate is placed to generate plasma between the lower electrode and the upper electrode, thereby processing the substrate.

In this plasma processing apparatus, conventionally, in order to enhance anisotropy of etching and increase etching rate and deposition rate for increased product yields, various process gases have been used and pressure and temperature of the process gases have been adjusted. Further, the present applicant has disclosed a method to keep high in-plane uniformity of plasma processing by varying impedance on an electrode side of the plasma generated in the process vessel to frequency of a radio-frequency power source (see, for example, Japanese Patent Application Laid-open No. 2004-96066).

SUMMARY OF THE INVENTION

For members such as the upper electrode and the lower electrode exposed in the process vessel, a material from which as little contamination as possible is generated by the plasma generated in the process vessel is used. As a measure for preventing these members from being affected by the plasma, their sidewall inner surfaces exposed in the process vessel are anodized, for instance. Thus, it has been a conventional tendency that the emission of components necessary for processing the substrate from the members exposed in the process vessel is reduced as much as possible.

It is an object of the present invention to improve plasma processing by causing a member exposed in a process vessel to emit a component necessary for processing a substrate when the substrate is processed with plasma generated in the process vessel.

To attain the above object, according to the present invention, there is provided a plasma processing apparatus in which a radio-frequency power from a radio-frequency power source is supplied to at least one of an upper electrode and a lower electrode disposed to vertically face each other in a process vessel, to thereby generate, in the process vessel, plasma with which a substrate is processed, wherein a chemical component emitting member which is caused to emit a chemical component necessary for processing the substrate into the process vessel by entrance of ions in the plasma generated in the process vessel is provided in the process vessel in an exposed state, and wherein an impedance varying circuit varying impedance on the chemical component emitting member side of the plasma generated in the process vessel to frequency of the radio-frequency power source is connected to the chemical component emitting member.

According to this plasma processing apparatus, the ions in the plasma is made to enter the chemical component emitting member exposed in the process vessel, thereby causing the chemical component emitting member to emit a chemical component necessary for processing a substrate, so that it is possible to improve the plasma processing.

In this plasma processing apparatus, the chemical component emitting member may be disposed on a lower surface of the upper electrode. Alternatively: the chemical component emitting member may be a focus ring provided around a periphery of the lower electrode. Alternatively, the chemical component emitting member may be disposed around the plasma generated in the process vessel.

The chemical component necessary for processing the substrate is, for example, oxygen. In this case, the chemical component emitting member is made of, for example, $SiO_2$.

Alternatively, the chemical component necessary for processing the substrate is, for example, fluorine. In this case, the chemical component emitting member is made of, for example, fluorocarbon resin.

According to another aspect of the present invention, there is provided a plasma processing method in which a radio-frequency power from a radio-frequency power source is supplied to at least one of an upper electrode and a lower electrode disposed to vertically face each other in a process vessel, to thereby generate, in the process vessel, plasma with which a substrate is processed, wherein a chemical component emitting member which is caused to emit a chemical component necessary for processing the substrate into the process vessel by entrance of ions in the plasma generated in the process vessel is disposed in the process vessel in an exposed state, and wherein impedance on the chemical component emitting member side of the plasma generated in the process vessel to frequency of the radio-frequency power source is varied, thereby controlling an emission amount of the component necessary for processing the substrate emitted into the process vessel from the chemical component emitting member.

In this plasma processing method, the chemical component necessary for processing the substrate is, for example, oxygen. In this case, the chemical component emitting member is made of, for example, $SiO_2$. Alternatively, the chemical component necessary for processing the substrate is, for example, fluorine. In this case, the chemical component emitting member is made of, for example, fluorocarbon resin.

According to the present invention, by making the ions in the plasma enter the chemical component emitting member exposed in the process vessel, it is possible for the chemical component emitting member to emit the component necessary for processing the substrate, and by the chemical component emitted in this manner, it is possible to improve performance of the plasma processing such as etching rate and etching anisotropy. In this case, by varying impedance on the chemical component emitting member side of the plasma generated in the process vessel to frequency of the radio-frequency power source, an amount of the ions entering the chemical component emitting member from the plasma is adjusted, so that it is possible to easily control an emission amount of the chemical component necessary for processing the substrate emitted from the chemical component emitting member into the process vessel.

DETAILED DESCRIPTION OF THE INVENTION

Figure 1:
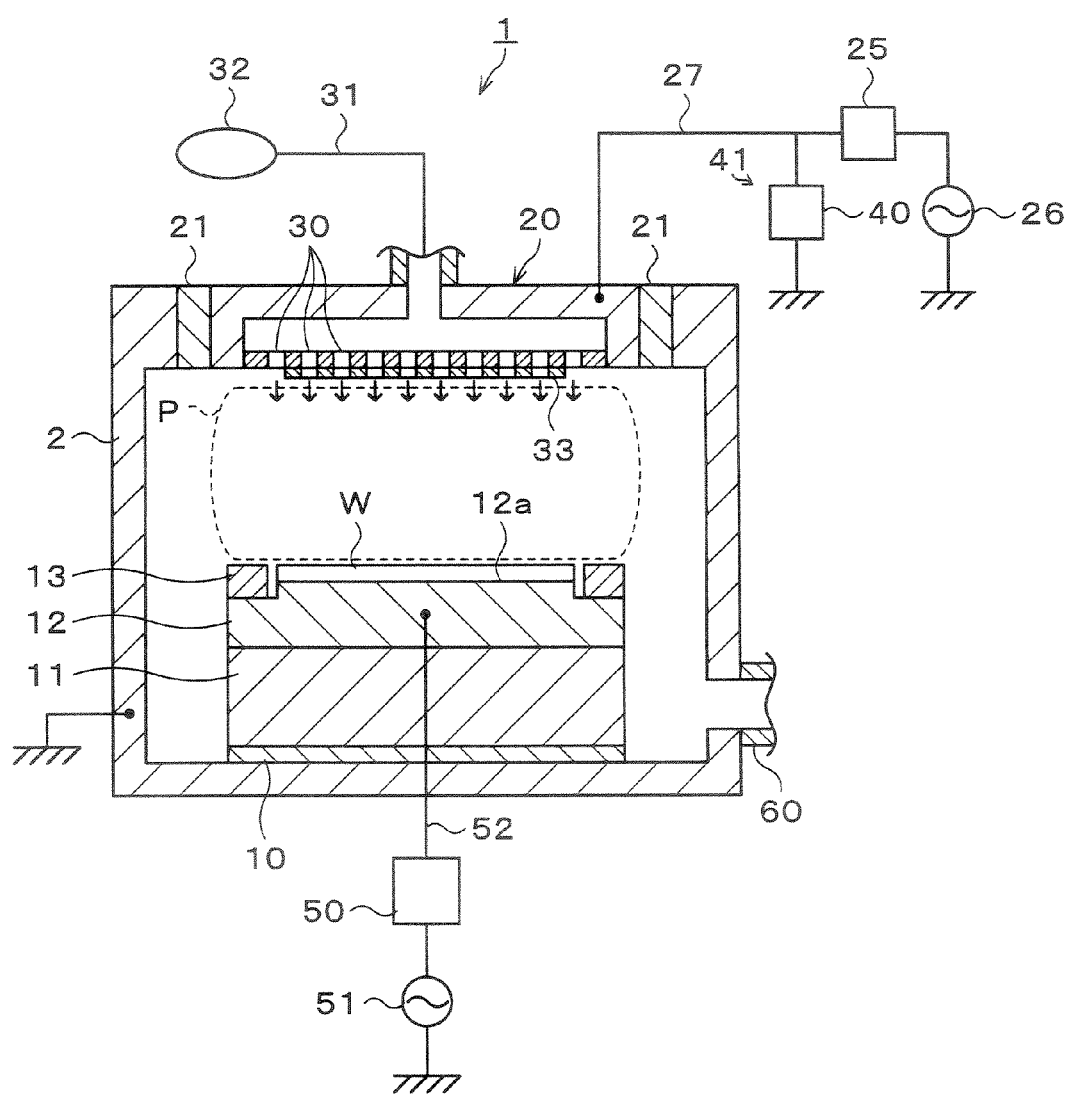
FIG. 1 is a vertical cross-sectional view showing a schematic construction of a plasma etching apparatus according to an embodiment of the present invention.
Figure 2:
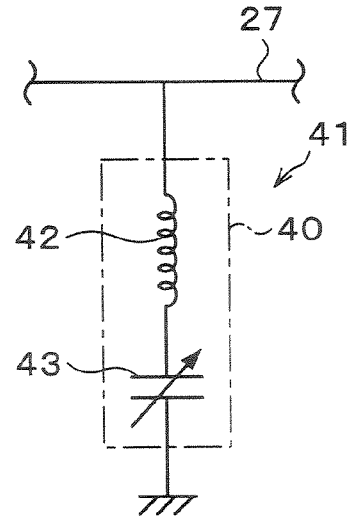
FIG. 2 is a circuitry diagram of an impedance varying part.

Hereinafter, preferred embodiments of the present invention will be described. FIG. 1 is a vertical cross-sectional view showing a schematic construction of a plasma etching apparatus 1 as a plasma processing apparatus according to an embodiment of the present invention. FIG. 2 is a circuitry diagram of an impedance varying part 40. In the present specification and drawings, constituent elements having substantially the same functions and structures are denoted by the same reference numerals and symbols, and repeated description thereof will be omitted.

As shown in FIG. 1, the plasma etching apparatus 1 includes a process vessel 2 in, for example, a substantially cylindrical shape. An inner wall surface of the process vessel 2 is covered by a protective film of, for example, alumina. The process vessel 2 is electrically grounded.

For example, in a center bottom portion in the process vessel 2, a columnar electrode support table 11 is provided via an insulation plate 10. On the electrode support table 11, a lower electrode 12 as a radio-frequency electrode serving also as a mounting table for placing a substrate W thereon is provided. For example, a center portion of an upper surface of the lower electrode 12 protrudes in a columnar shape, and the substrate (semiconductor wafer) W is held on this protruding portion 12a. A ring-shaped focus ring 13 made of quartz is provided around a periphery of the protruding portion 12a of the lower electrode 12.

In a ceiling portion facing the lower electrode 12 in the process vessel 2, an upper electrode 20 in, for example, a substantially disk shape is attached so as o make a pair with the lower electrode 12. In a contact portion between the upper electrode 20 and a ceiling wall portion of the process vessel 2, a ring-shaped insulator 21 is interposed to electrically insulate the upper electrode 20 from the ceiling wall portion of the process vessel 2.

A first radio-frequency line 27 supplying a radio-frequency power for plasma generation from a first radio-frequency power source 26 via a matching circuit 25 is electrically connected to the upper electrode 20. This first radio-frequency power source 26 generates, for example, a 60 MHz radio-frequency power and supplies the radio-frequency power for plasma generation to the upper electrode 20.

For example, a large number of gas ejecting holes 30 are formed in a lower surface of the upper electrode 20. The gas ejecting holes 30 communicate with a gas supply source 32 via a gas supply pipe 31 connected to an upper surface of the upper electrode 20. The gas supply source 32 stores a process gas for etching. The process gas introduced from the gas supply source 32 into the upper electrode 20 through the gas supply pipe 31 is supplied into the process vessel 2 through the plurality of gas ejecting holes 30.

Further, on a center portion of the lower surface of the upper electrode 20, a chemical component emitting member 33 which is a feature of the present invention is provided in an exposed state in the process vessel 2. This chemical component emitting member 33 is attached in electrical continuity to the upper electrode 20, and the chemical component emitting member 33 and the upper electrode 20 are equal in potential. As will be described later, when plasma P is generated in the process vessel 2 by supply of the radio-frequency power to the upper electrode 20 and the lower electrode 12, ions in the plasma P are made to enter the chemical component emitting member 33, thereby causing the chemical component emitting member 33 to emit a component necessary for processing the semiconductor wafer W into the process vessel 2.

A material of the chemical component emitting member 33 can be, for example, $SiO_2$, though differing depending on a component to be emitted into the process vessel 2. The chemical component emitting member 33 thus made of $SiO_2$ can emit oxygen as a component necessary for processing the semiconductor wafer W into the process vessel 2, when the ions in the plasma P enter the chemical component emitting member 33.

Alternatively, the chemical component emitting member 33 can be made of, for example, fluorocarbon resin. The chemical component emitting member 33 thus made of fluorocarbon resin can emit fluorine as a component necessary for processing the semiconductor wafer W into the process vessel 2, when ions in the plasma P enter the chemical component emitting member 33.

The chemical component emitting member 33 of the embodiment shown in FIG. 1 is attached to cover the center portion of the lower surface of the upper electrode 20. However, holes for passing the process gas therethrough are formed in the chemical component emitting member 33, in correspondence to the gas ejecting holes 30 formed in the lower surface of the upper electrode 20. Therefore, the process gas introduced into the upper electrode 20 from the gas supply source 32 is smoothly supplied into the process vessel 2 through the plurality of gas ejecting holes 30 without being obstructed by the chemical component emitting member 33.

Further, an impedance varying circuit 41 including an impedance varying part 40 varying impedance on the chemical component emitting member 33 side of the plasma P generated in the process vessel 2 to frequency of a second radio-frequency power source 51 is connected to a position between the upper electrode 20 and the matching circuit 25 in the aforesaid radio-frequency line 27. Note that in this embodiment, the chemical component emitting member 33 and the upper electrode 20 are in electrical continuity to each other and are equal in potential, as described above. Therefore, in this embodiment, the impedance varying circuit 41 is connected to the first radio-frequency line 27 for supplying the radio-frequency power to the upper electrode 20 from the first radio-frequency power source 26, so that the impedance varying part 40 can vary the impedance on the chemical component emitting member 33 side of the plasma P generated in the process vessel 2 (equal to impedance on the upper electrode 20 side) to frequency of the first radio-frequency power source 26.

As shown in FIG. 2, the impedance varying part 40 is included in the impedance circuit 41 connecting the first radio-frequency line 27 and the ground side and is composed of a fixed coil 42 with inductance of, for example, about 200 nH and a variable capacitor 43 which are serially connected. By varying capacitance of the variable capacitor 43 in the impedance varying part 40, it is possible to appropriately vary the impedance on the chemical component emitting member 33 side of the plasma P generated in the process vessel 2 to frequency of the second radio-frequency power source 51.

A second radio-frequency line 52 for supplying a radio-frequency power for bias from the second radio-frequency power source 51 via a matching circuit 50 is electrically connected to the lower electrode 12. This second radio-frequency power source 51 generates a radio-frequency power with a frequency lower than that of the first radio-frequency power source 26, for example, a 13.56 MHz radio-frequency power, and supplies the radio-frequency power for bias to the lower electrode 12. Incidentally, the plasma P is sometimes generated in the process vessel 2 also by this second radio-frequency power source 51.

As shown in FIG. 1, an exhaust pipe 60 connected to an exhaust mechanism (not shown) is connected to a lower portion of the process vessel 2. By vacuuming the inside of the process vessel 2 through the exhaust pipe 60, it is possible to reduce the pressure inside the process vessel 2 to a predetermined pressure.

Next, the operation of the plasma etching apparatus 1 as constructed above will be described.

To perform plasma etching in this plasma etching apparatus 1, first, the substrate W is carried into the process vessel 2 to be placed on the lower electrode 12 as shown in FIG. 1. Then, the inside of the process vessel 2 is exhausted through the exhaust pipe 60 to be reduced in pressure, and further a predetermined process gas supplied from the gas supply source 32 is supplied into the process vessel 2 through the gas ejecting holes 30. Further, the first radio-frequency power source 26 supplies the radio-frequency power for plasma generation of, for example, 60 MHz to the upper electrode 20. Further, the second radio-frequency power source 51 supplies the radio-frequency power for bias of, for example, 13.56 MHz to the lower electrode 12.

Consequently, the radio-frequency power is applied between the lower electrode 12 and the upper electrode 20 and the plasma P is generated between the lower electrode 12 and the upper electrode 20 in the process vessel 2. By this plasma P, active species, ions, and so on are generated from the process gas, so that a surface film of the semiconductor wafer W placed on the lower electrode 12 is etched. After the etching for a predetermined time, the supply of the radio-frequency powers to the upper electrode 20 and the lower electrode 12 and the supply of the process gas into the process vessel 2 are stopped, the wafer W is carried out of the process vessel 2, and a series of the plasma etching processes is finished.

Here, during the above plasma etching, the capacitance of the variable capacitor 43 is adjusted in the above-described impedance varying part 40 connected to the chemical component emitting member 33, whereby the impedance on the chemical component emitting member 33 side (upper electrode 20 side) of the plasma P is changed so as to resonate the frequency of the second radio-frequency power source 51.

The impedance on the chemical component emitting member 33 side of the plasma P is thus changed, so that the ions in the plasma P are made to enter the chemical component emitting member 33. Consequently, the chemical component emitting member 33 can be caused to emit a component necessary for processing the semiconductor wafer W into the process vessel 2.

In this case, appropriately selecting a material of the chemical component emitting member 33 can change the component which is emitted into the process vessel 2 from the chemical component emitting member 33 by the entrance of the ions. As an example, in a case where a Si substrate as the semiconductor wafer W is etched, $SiO_2$ is used as the material of the chemical component emitting member 33. This enables the chemical component emitting member 33 to emit oxygen into the process vessel 2 when the ions in the plasma P enter the chemical component emitting member 33.

Figure 3:
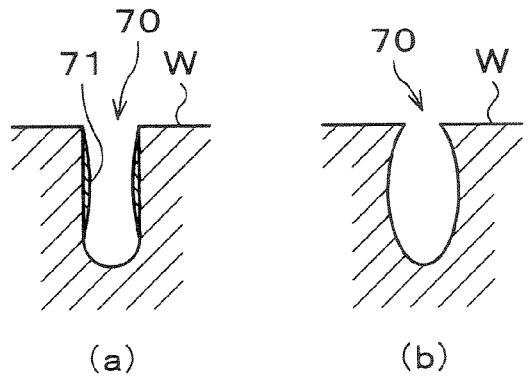
FIG. 3(a) and FIG. 3(b) are views to explain a case where of a hole is formed in a semiconductor wafer by etching, FIG. 3(a) showing a state where etching with high anisotropy is performed and FIG. 3(b) showing a state where the hole has a bowing shape.

Here, with reference to FIGS. 3(a), 3(b), a case where $O_2$ and SF6 or HBr are used as the process gas and the Si substrate as the semiconductor wafer W is etched to form a hole 70 will be described. By making the ions in the plasma P enter the chemical component emitting member 33 made of $SiO_2$ to cause the chemical component emitting member 33 to emit oxygen into the process vessel 2, it is possible to supply sufficient oxygen into the process vessel 2. Consequently, as shown in FIG. 3(a), oxygen in the process vessel 2 reacts with Si, so that a Si oxide film ($SiO_2$) 71 is formed on a sidewall surface of the hole 70 formed by the etching. The oxide film 71 protects the sidewall surface of the hole 70, which makes it possible to etch a surface of the semiconductor wafer W with high vertical anisotropy.

On the other hand, if oxygen is not sufficiently supplied into the process vessel 2, the sidewall surface of the hole 70 is not protected, resulting in isotropic etching as shown in FIG. 3(b). In such a case, the hole 70 formed in the surface of the semiconductor wafer W has a bowing shape.

Alternatively, for example, in a case where an oxide film ($SiO_2$) formed on the surface of a Si substrate as the semiconductor wafer W is etched, fluorocarbon resin, for instance, is used as the material of the chemical component emitting member 33. Consequently, when the ions in the plasma P enter the chemical component emitting member 33, the chemical component emitting member 33 emits fluorine indispensable for etching the oxide film into the process vessel 2, which can increase etching rate.

According to the plasma etching apparatus I of this embodiment, by appropriately selecting the material of the chemical component emitting member 33 disposed in an exposed state in the process vessel 2, it is possible to cause the chemical component emitting member 33 to emit the component necessary for processing the semiconductor wafer W when the ions in the plasma P are made to enter the chemical component emitting member 33. Consequently, anisotropy of the etching can be enhanced and the etching rate can be also increased.

In this case, for example, concentration of the process gas or the ion generation state in the process vessel 2 is monitored, and based on the monitoring result, the impedance on the chemical component emitting member 33 side of the plasma P generated in the process vessel 2 to the frequency of the second radio-frequency power source 51 is varied to adjust an incident amount of the ions entering the chemical component emitting member 3 from the plasma P. Consequently, it is possible to easily control an emission amount of the component such as oxygen or fluorine influencing the plasma processing, which is emitted into the process vessel 2 from the chemical component emitting member 33.

Hitherto, an example of a preferred embodiment of the present invention has been described, but the present invention is not limited to the form exemplified here. It is obvious that those skilled in the art could reach various modified examples or corrected examples within a range of the spirit described in the claims, and it should be naturally understood that these examples also belong to the technical scope of the present invention. For example, in FIG. 2, the case is described where the serial circuit of the variable capacitor 43 and the fixed coil 42 is used as the impedance varying part 40, but the impedance varying part 40 is not limited to this and may be any circuit, providing that it can vary the impedance on the chemical component emitting member 33 side of the plasma P to the frequency of the second radio-frequency power source 51.

Figure 4:
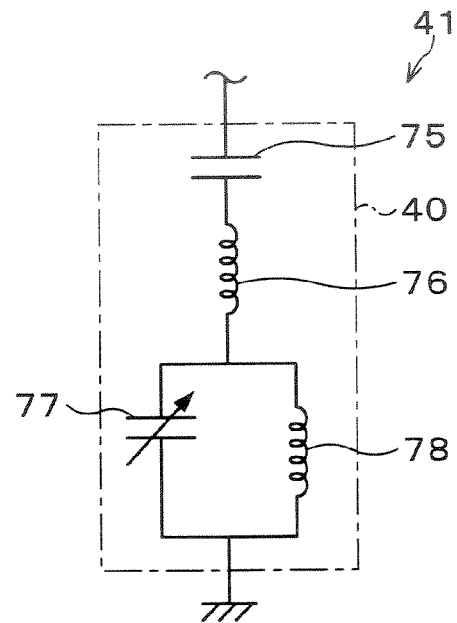
FIG. 4 is a circuit diagram showing a modified example of an impedance varying circuit.

FIG. 4 is a circuit diagram showing another structure of the impedance varying part 40. The impedance varying part 40 shown in FIG. 4 has circuitry in which a fixed capacitor 75, a fixed coil 76, and a variable capacitor 77 are serially connected and a fixed coil 78 is connected in parallel to the variable capacitor 77, in the impedance varying circuit 41 connecting the first radio-frequency line 27 and the ground side.

The impedance varying part 40 shown in FIG. 4 can also easily vary the impedance on the chemical component emitting member 33 side of the plasma P to the frequency of the second radio-frequency power source 51, by varying the capacitance of the variable capacitor 77. Further, connecting the fixed coil 78 in parallel to the variable capacitor 77 facilitates fine adjustment. Further, providing the fixed capacitor 75 makes it possible to shift radio-frequency voltage flowing to the ground side from the impedance varying circuit 41, which contributes to the protection of the impedance varying part 40.

Figure 5:
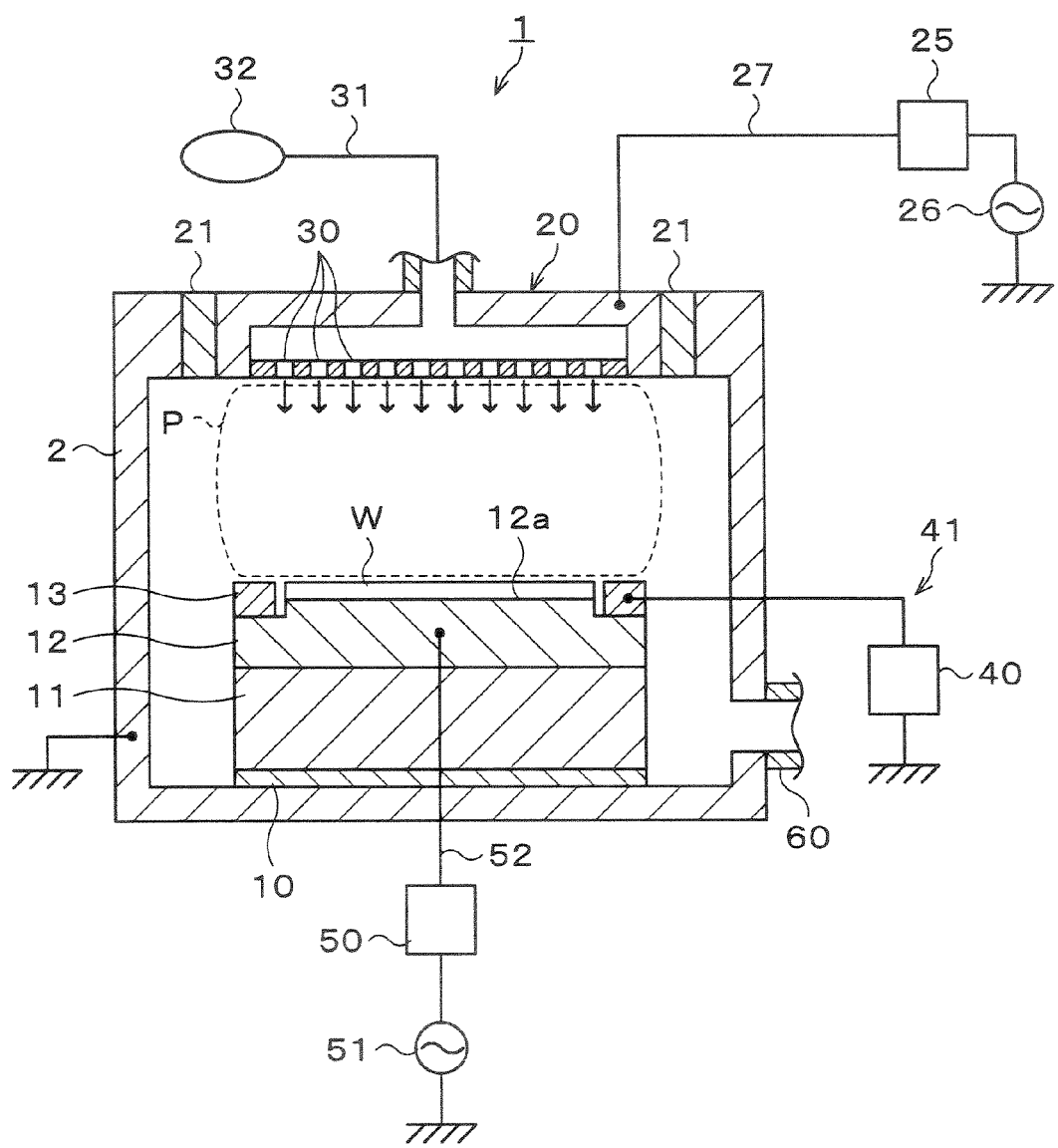
FIG. 5 is a vertical cross-sectional view showing a schematic construction of a plasma etching apparatus according to an embodiment where a focus ring serves as a chemical component emitting member.

In FIG. 1, the case is described where the chemical component emitting member 33 is disposed on the lower surface of the upper electrode 20, but this is not restrictive, but the chemical component emitting member may be disposed at any place exposed to the plasma P generated in the process vessel 2. FIG. 5 shows an example where the focus ring 13 disposed around the periphery of the lower electrode is used as the chemical component emitting member. In this case, the impedance varying circuit 41 including the impedance varying part 40 is connected to the focus ring 13, thereby varying the impedance on the focus ring 13 (chemical component emitting member) side of the plasma P generated in the process vessel 2 to frequency of the first radio-frequency power source 26 or the second radio-frequency power source 51.

According to the example shown in FIG. 5, by making the ions in the plasma P enter the focus ring 13, it is possible to cause the focus ring 13 to emit the component such as oxygen or fluorine necessary for processing the semiconductor wafer W into the process vessel 2. In this manner, a member (focus ring 13) originally provided in the process vessel 2 for other purpose may be used as the chemical component emitting member. Needless to say, a member other than the focus ring 13 may be used.

Figure 6:
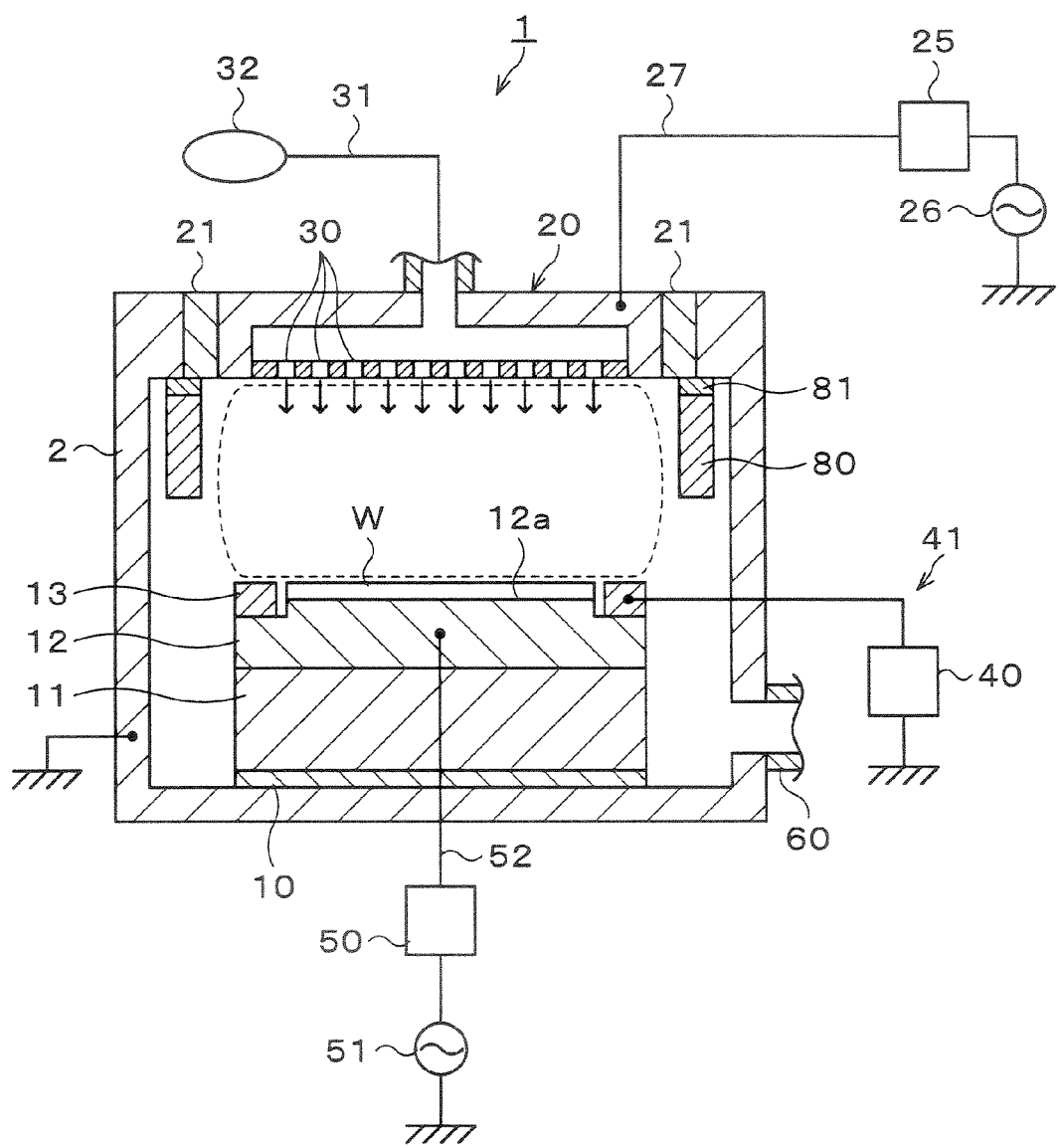
FIG. 6 is a vertical cross-sectional view showing a schematic construction of a plasma etching apparatus according to an embodiment where a chemical component emitting member is disposed around plasma generated in a process vessel.

FIG. 6 shows an example where a cylindrical chemical component emitting member 80 is disposed to surround the plasma P generated in the process vessel 2. In this example, the chemical component emitting member 80 is attached to the ceiling portion of the process vessel 2 via an insulating member 81. Further, the impedance varying circuit 41 including the impedance varying part 40 is connected to the chemical component emitting member 80, thereby varying impedance on the chemical component emitting member 80 side of the plasma P generated in the process vessel 2 to frequency of the first radio-frequency power source 26 or the second radio-frequency power source 51.

According to the example shown in FIG. 6, by making the ions in the plasma P enter the chemical component emitting member 80 surrounding the plasma P, it is possible to cause the chemical component emitting member 80 to emit the component such as oxygen or fluorine necessary for processing the semiconductor wafer W from the plasma P into the process vessel 2.

Figure 7:
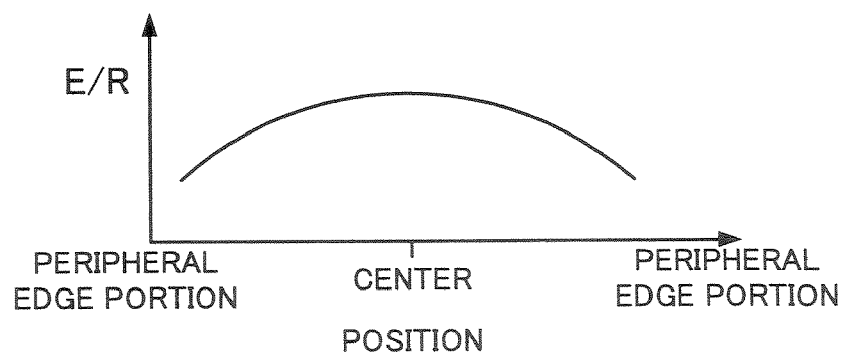
FIG. 7 is a graph showing etching rate in center and peripheral edge portions of a semiconductor wafer.

Incidentally, for example, when the semiconductor wafer W is etched, there sometimes occurs such a situation that etching rate E/R is higher in the center of the semiconductor wafer W and etching rate E/R is lower in a peripheral edge portion of the semiconductor wafer W as shown in FIG. 7. In such a case, according to the example shown in FIG. 5 and the example shown in FIG. 6, the component such as oxygen or fluorine is emitted from the focus ring 13 or the chemical component emitting member 80 disposed around the plasma P, thereby increasing the etching rate E/R in the peripheral edge portion of the semiconductor wafer W, so that in-plane processing uniformity can be enhanced.

On the other hand according to the example previously described with reference to FIG. 1, the chemical component emitting member 33 disposed on the center of the lower surface of the upper electrode 20 is caused to emit the component such as oxygen or fluorine. For example, in a case where the semiconductor wafer W is etched, there may be a case where the etching rate E/R is lower in the center of the semiconductor wafer W and the etching rate E/R is higher in the peripheral edge portion of the semiconductor wafer W (a case reverse to that shown in FIG. 7). In such a case, the component such as oxygen or fluorine is emitted from the chemical component emitting member 33 provided on the center of the lower surface of the upper electrode 20 as shown in FIG. 1, thereby increasing the etching rate E/R in the center portion of the semiconductor wafer W, so that in-plane uniformity of the processing can be enhanced.

Figure 8:
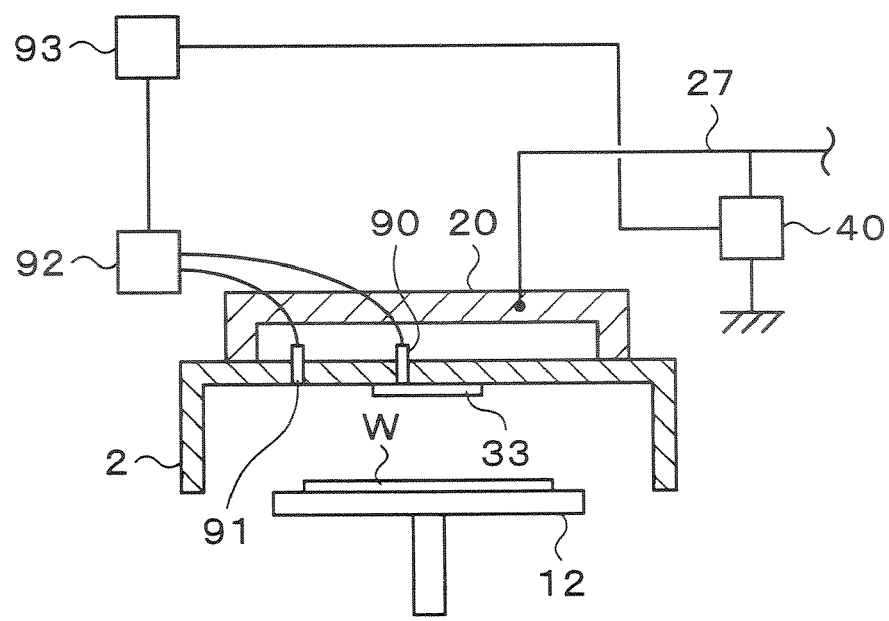
FIG. 8 is a vertical cross-sectional view showing a schematic construction of a plasma etching apparatus according to an embodiment including sensors detecting emission intensity (radical density) of plasma in the center and peripheral edge portions of the semiconductor wafer.

For example, as shown in FIG. 8, sensors 90, 91 detecting emission intensity (radical density) of the plasma P in the process vessel 2 are mounted in a center portion and a peripheral edge portion of the ceiling portion of the process vessel 2. The emission intensities in the center portion and the peripheral edge portion of the semiconductor wafer W are inputted from these sensors 90, 91 to a computing device 93 via a spectroscope 92. The computing device 93 computes an adjustment angle of the variable capacitor 43 of the impedance varying part 40 which is to be controlled, based on a ratio of the emission intensities in the center portion and the peripheral portion of the semiconductor wafer W. While the variable capacitor 43 is controlled based on thus computed adjustment angle, the ions in the plasma P are made to enter the chemical component emitting member 33, which can equalize the emission intensities (radical densities) in the center portion and the peripheral edge portion of the semiconductor wafer W. Consequently, uniform plasma processing is enabled.

Incidentally, the chemical component emitting member 33, shown in FIG. 1, disposed on the lower surface of the upper electrode 20, the chemical component emitting member, shown in FIG. 5, constituted by the focus ring 13, and the chemical component emitting member 80, shown in FIG. 6, disposed around the plasma P may be appropriately combined.

The above embodiments have described the examples where the radio-frequency power sources 26, 51 are connected to the upper electrode 20 and the lower electrode 12 respectively, but this is not restrictive. The present invention is of course applicable to a case where a radio-frequency power source is connected to only one of the electrodes. Further, in the above-described embodiments, the present invention is applied to the plasma etching apparatus 1, but the present invention is also applicable to a plasma processing apparatus for performing substrate processing other than etching, for example, for performing film formation. Further, the substrate processed in the plasma processing apparatus of the present invention may be any of a semiconductor wafer, an organic EL substrate, a substrate for FPD (flat panel display), and the like.

What is claimed is:

1. A plasma processing method, comprising: supplying radio-frequency power from a radio-frequency power source to at least one of an upper electrode and a lower electrode facing each other along a vertical direction in a process vessel, to thereby generate, in the process vessel, plasma to process a substrate, wherein a chemical component emitting member disposed in the process vessel in an exposed state emits into the process vessel a chemical component necessary for processing the substrate by entrance of ions into the plasma generated in the process vessel, wherein an impedance varying circuit varying impedance on said chemical component emitting member side of the plasma generated in the process vessel to the frequency of the radio-frequency power source is connected to the component emitting member, and wherein the impedance varying circuit varies the impedance, thereby controlling an emission intensity of the component necessary for processing the substrate emitted into the process vessel from said chemical component emitting member.

2. The plasma processing method according to claim 1, wherein the chemical component necessary for processing the substrate is oxygen.

3. The plasma processing method according to claim 2, wherein said chemical component emitting member is made of $SiO_2$.

4. The plasma processing method according to claim 1, wherein the chemical component necessary for processing the substrate is fluorine.

5. The plasma processing method according to claim 4, wherein said chemical component emitting member is made of fluorocarbon resin.

6. The plasma processing method according to claim 1, wherein the impedance varying circuit has a fixed coil and a variable capacitor.

7. The plasma processing method according to claim 1, wherein said chemical component emitting member is disposed on a lower surface of the upper electrode.

8. The plasma processing method according to claim 1, wherein said chemical component emitting member is a focus ring provided around a periphery of the lower electrode.

9. The plasma processing method according to claim 1, wherein said chemical component emitting member is disposed around the plasma generated in the process vessel.

10. The plasma processing method according to claim 6, wherein a sensor detecting emission intensity of the plasma is provided in the process vessel, and the variable capacitor of the impedance varying circuit is adjusted based on a result of the detection by the sensor.

* * * * *